(12) United States Patent
Ajioka et al.

(10) Patent No.: US 6,917,526 B2
(45) Date of Patent: Jul. 12, 2005

(54) ELECTRONIC COMPONENT MODULE

(75) Inventors: Eriko Ajioka, Tokyo (JP); Shigeru Asami, Tokyo (JP); Hideaki Shimoda, Tokyo (JP); Hiroshi Ikeda, Tokyo (JP); Yoshinari Yamashita, Tokyo (JP); Hitoyoshi Kurata, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/829,272

(22) Filed: Apr. 22, 2004

(65) Prior Publication Data

US 2004/0264156 A1 Dec. 30, 2004

(30) Foreign Application Priority Data

Apr. 24, 2003 (JP) ........................................ 2003-119183

(51) Int. Cl.[7] .............................................. H05K 9/00
(52) U.S. Cl. ...................................... 361/816; 361/818
(58) Field of Search ............................... 361/752, 753, 361/799, 800, 816, 818, 212, 220; 343/778, 789, 700 MS, 246, 247; 257/728; 174/35 R, 52.2

(56) References Cited

U.S. PATENT DOCUMENTS 5,373,104 A * 12/1994 Brauer ....................... 174/52.1
5,777,856 A * 7/1998 Phillips et al. .............. 361/816
5,828,339 A    10/1998 Patel
6,690,582 B2 * 2/2004 Sumida ...................... 361/752
6,862,186 B2 * 3/2005 Belady et al. ............... 361/721
2002/0065052 A1  5/2002 Pande et al.
2002/0167060 A1 11/2002 Buijsman et al.

FOREIGN PATENT DOCUMENTS

JP           6-326488       11/1994
JP           9-237867        9/1997
JP          11-340371       12/1999

* cited by examiner

Primary Examiner—Phuong T. Vu
(74) Attorney, Agent, or Firm—Oblon, Spivak, McClelland, Maier & Neustadt, P.C.

(57) ABSTRACT

An electronic component module includes: printed-circuit boards on which a shield layer is formed; a spacer positioned between the printed-circuit boards, the spacer equipped with a shielding feature which forms as partitions a first cavity and a second cavity between the printed-circuit boards; a first electronic component positioned in the first cavity and mounted on any one of the printed-circuit boards and used in a first frequency band; a second electronic component positioned in the second cavity and mounted on any one of the printed-circuit boards, the second electronic component used in a second frequency band; a patch antenna formed on the surface of the printed-circuit board opposite that on which the spacer is mounted, the antenna transmitting and receiving radio waves at least one of in the first and second frequency bands; and terminals formed on the surface of the printed-circuit board opposite that on which the spacer is mounted.

6 Claims, 3 Drawing Sheets

ELECTRONIC COMPONENT MODULE

BACKGROUND OF THE INVENTION

The present invention relates to an electronic component module and in particular to an electronic component module on which electronic components operating in a plurality of frequency bands are mounted.

There is a growing need for a more compact and higher-performance communications system used in the microwave band or millimeter band with easy broadband applicability and higher resolution. As a solution to satisfy such a need and reduce transmission loss between the electronic components of a communications system, there is known a technology which packs high-frequency devices or electronic components such as an amplifier, a mixer, an oscillator and a multiplier into an electronic component module in the form of a package, as mentioned in JP-A-9-237867 (1997).

Further, JP-A-6-326488 (1984) discloses a technique to shield input and output terminals while keeping out of the way of cable routing in order to avoid the influence of malfunctions caused by an electromagnetic wave in such an electronic component module.

However, the technologies described in these official gazettes require dedicated substrates and cases. Fabricating an electronic component module by using such a substrate and a case requires a complicated manufacturing process and time, thus resulting in higher costs.

Another approach of advancing the feature of the electronic component module is to install electronic components operating in frequency bands different from each other in a single package. The technologies described in the official gazettes do not consider this point.

The inventions aims at providing an electronic component module which installs electronic components operating in frequency bands different from each other in a single package and which can be manufactured at a low cost.

SUMMARY OF THE INVENTION

In order to solve the problems, an electronic component module according to the invention comprises: a pair of printed-circuit boards on which a shield layer is formed; a spacer positioned between and fixed to the pair of printed-circuit boards, the spacer equipped with a shielding feature which forms as partitions at least a first cavity and a second cavity between the pair of printed-circuit boards; at least a first electronic component positioned in the first cavity and mounted on any one of the pair of printed-circuit boards and used in a first frequency band; at least a second electronic component positioned in the second cavity and mounted on any one of the pair of printed-circuit boards, the second electronic component used in a second frequency band different from the first frequency band; and a plurality of terminals formed on a surface of any one of the pair of printed-circuit boards, the surface opposite that on which the spacer is mounted, the terminals connected to the first electronic component and the second electronic component via transmission lines.

According to the invention, the first and the second electronic components are shielded per frequency band thus improving the isolation characteristic. An existing printed-circuit board and a low-cost spacer extremely easy to work on are used as components. It is thus possible to install electronic components operating in frequency bands different from each other in a single package thereby providing an electronic component module ready to manufacture at a low cost.

The electronic component module according to a preferred embodiment of the invention comprises one or more antennas formed on a surface of one of the pair of printed-circuit boards which does not mount the terminals, the surface opposite that on which the spacer is mounted, characterized in that the one or more antennas transmit/receive radio waves in at least any one of the first frequency band and the second frequency band, the one or more antennas connected to the corresponding electronic components.

This shortens the wiring length between an antenna and an electronic component thus reducing the transmission loss.

The electronic component module according to a preferred embodiment of the invention is characterized in that the spacer is made of a metal or a nonmetal on which a metallic shield layer is formed.

This makes it possible to install electronic components operating in frequency bands different from each other in a single package, thereby providing an electronic component module ready to manufacture at a low cost.

The electronic component module according to a preferred embodiment of the invention is characterized in that at least one of the electronic components is mounted on the printed-circuit board via a substrate component with higher heat resistance than the printed-circuit board.

This allows an electronic component which requires thermo-compression bonding to be mounted on a printed-circuit board with low heat resistance.

DETAILED DESCRIPTION OF THE PREFERRED EMBODIMENTS

Figure 1:
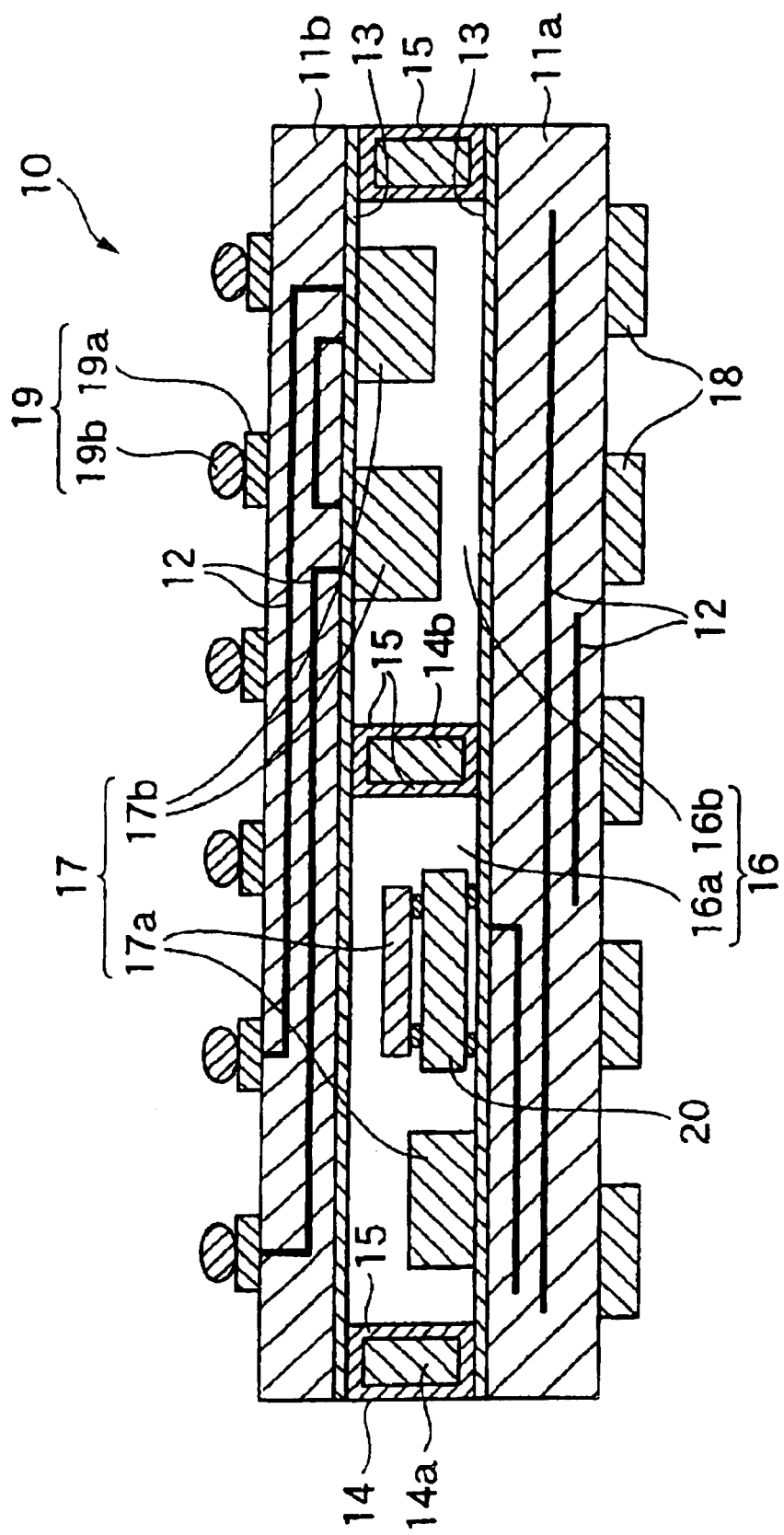
FIG. 1 is a sectional view of an electronic component module according to an embodiment of the invention.

Embodiments of the invention are described below in detail referring to attached drawings. In the attached drawings, same members are assigned a same reference numeral and duplicated description is omitted. The embodiments are particularly useful embodiments of the invention and the invention is by no means limited to the embodiments.

Figure 2:
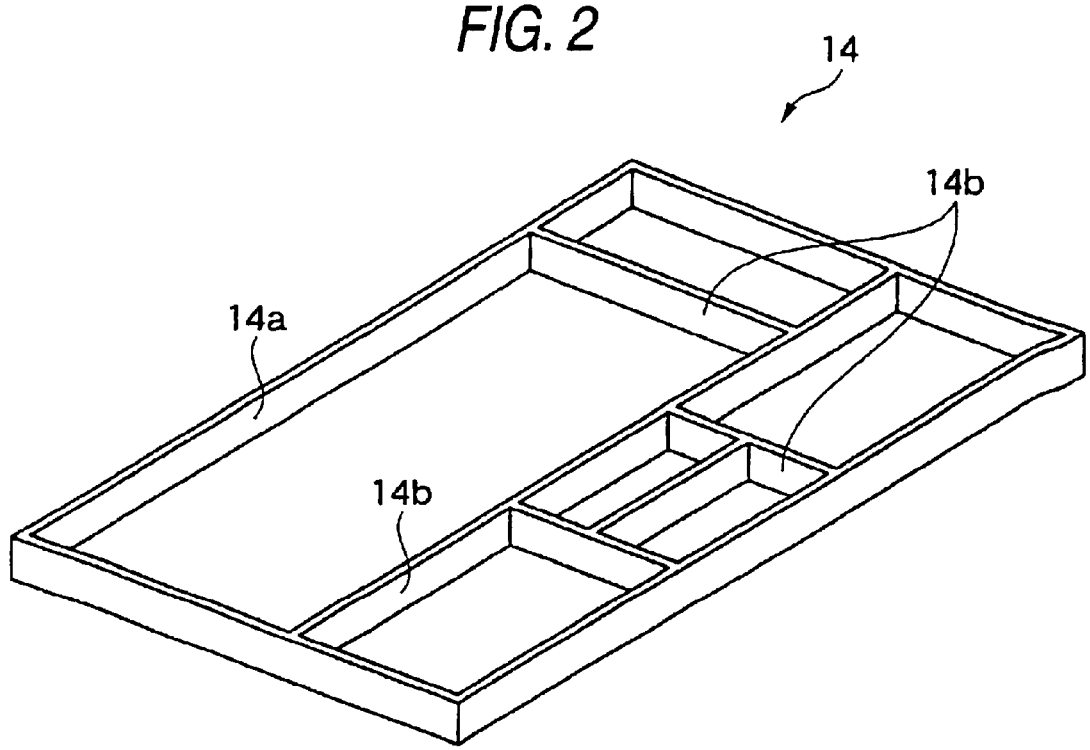
FIG. 2 is a perspective view of a spacer used in the electronic component module in shown FIG. 1.
Figure 3:
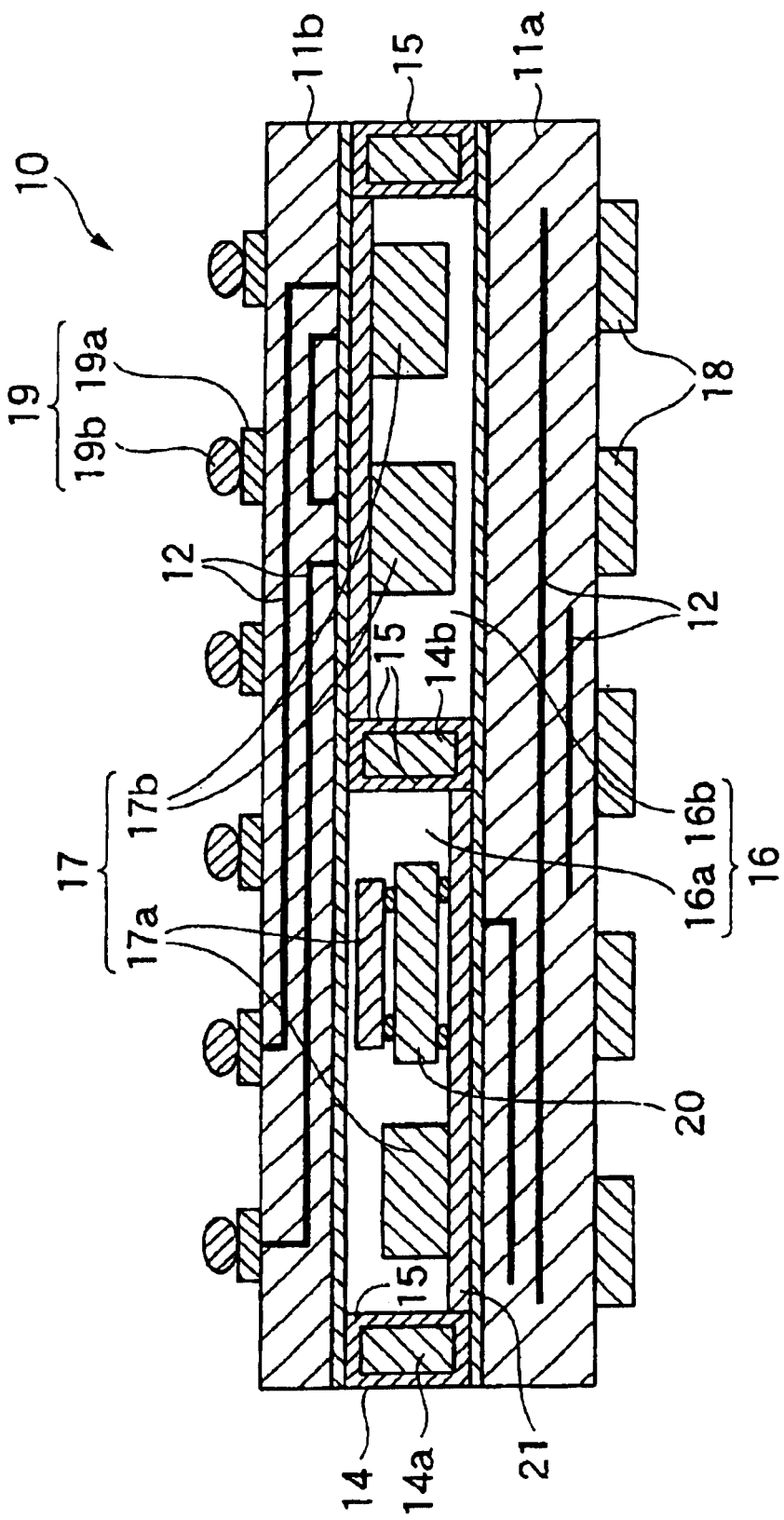
FIG. 3 is a sectional view of an electronic component module according to another embodiment of the invention.

FIG. 1 is a sectional view of an electronic component module according to an embodiment of the invention. FIG. 2 is a perspective view of a spacer used in the electronic component module shown in FIG. 1. FIG. 3 is a sectional view of an electronic component module according to another embodiment of the invention.

As shown in FIG. 1, the electronic component module 10 according to this embodiment is equipped with printed-circuit boards 11a, 11b as a pair comprising a dielectric such as ceramic and resin. On the printed-circuit boards 11a, 11b are laminated transmission lines 12 and a ground layer. On one surface of each of the printed-circuit boards 11a, 11b are formed the exposed transmission lines 12 and a shield layer comprising metal plating. The transmission lines 12 and the shield layer are made of for example Au, Ag, Cu or W. The shield layer 13 may be used in common with the ground layer.

Between the pair of printed-circuit boards 11a, 11b is positioned a spacer 14 which is fixed to the printed-circuit boards 11a, 11b. For example, a screw joint or solder joint is available as a fixing method. As shown in FIG. 2, the spacer 14 is composed of a non-metal member such as resin or ceramic where an outer frame 14a and a partition wall 14b for partitioning the area surrounded by the outer frame 14a into a plurality of sub-areas are integrated. On the entire surface of the spacer 14 is formed a shield layer on which metal plating is applied (FIG. 1). Such a spacer 14 is sandwiched between the pair of printed-circuit boards 11a, 11b so that multiple cavities 16 are formed as partitions between the printed-circuit boards 11a, 11b.

The shield layer 13 formed on the printed-circuit boards 11a, 11b and the shield layer 15 formed on the spacer 14 electromagnetically shield the cavities 16 except the exposed transmission lines in all directions.

While the spacer 14 is shielded by applying metal plating onto a resin, the spacer 14 may be made of metal to provide a shielding feature.

In the cavities 16 are arranged electronic components 17 as a plurality of high-frequency devices mounted on the printed-circuit boards 11a, 11b. These electronic components 17 include a plurality of first electronic components 17a used in the submillimeter band, for example 25 GHz (first frequency band) and a plurality of second electronic components 17b used in the microwave band, for example, 5 GHz (second frequency band) The first electronic components 17a and the second electronic components 17b are installed in the separate cavities 16. To be more precise, the first electronic components 17a are installed in the first cavity 16a while the second electronic components 17b are installed in the second cavity 16b.

As mentioned earlier, both cavities 16a, 16b are electromagnetically shielded except the exposed transmission lines in all directions. Thus, by installing the first electronic components 17a and the second electronic components 17b in the first cavity 16a and the second cavity 16b respectively, the electronic components 17a, 17b are shielded per frequency to prevent interaction. This improves the isolation characteristic thereby obtaining a stable performance characteristic.

The first cavity 16a or the second cavity 16b may be single or plural. The cavity 16 has a shape of a rectangle when illustrated, but may have various shapes, such as a circle and an ellipse.

The shape of the cavity 16 is preferably formed so that an unwanted propagation mode or an unwanted resonance mode will not take place in the operating frequency band of the electronic component 17 in the cavity 16.

For example, in case the electronic component 17 is a power amplifier, an unwanted propagation mode in the cavity 16 in the operating frequency band of the electronic component 17 forms a transmission line other than the transmission lines 12 in the space. This could degrade the performance of the electronic component 10, that is, the backward passing characteristic or isolation characteristic of the electronic component 17. In order to solve such a problem, the cavity is preferably formed so that the frequency band in which the cavity 16 can operate as a waveguide when the propagation mode appears in the cavity 16 will be higher than the operating frequency band of the electronic component 17.

An unwanted resonance mode in the cavity 16 in the operating frequency band of the electronic component 17 could degrade the performance of the electronic component 10, for example, degrade the transmission characteristic of the transmission lines 12. The cavity is preferably formed so that the operating frequency band of the electronic component 17 and the frequency at which an unwanted resonance mode takes place will be different from each other.

The "unwanted propagation mode" refers to the form of electromagnetic field distribution in which the cavity 16 is operable as a waveguide in the operating frequency range of the electronic component 17. The "unwanted resonance mode" refers to the form of electromagnetic field distribution in which the cavity 16 is operable as a waveguide resonator in the operating frequency range of the electronic component 17.

The aforementioned frequencies are exemplary. The invention is not limited to these frequencies as long as the operating frequency bands of the mounted electronic components 17 differ from each other.

While the first electronic component 17a is mounted on the printed-circuit board 11a and the second electronic component 17b is mounted on the printed-circuit board 11b, these electronic components may be mounted on the same printed-circuit board 11a (11b).

While the electronic components 17 operating in two frequency bands are mounted in this embodiment, it is possible to mount electronic components operating in three or more of frequency bands. In this case, the electronic components operating in the frequency bands are installed in cavities different from each other.

Referring to FIG. 1, some of the first electronic components 17a are mounted on the printed-circuit board 11a for example via a ceramic substrate component 20. In case the first electronic component 17a is mounted on the printed-circuit board 11a by way of thermo-compression bonding of Au—Sn alloy, for example using heat treatment at some 400° C. (degrees centigrade), mounting is substantially impossible when the printed-circuit board 11a is made of non-heat-resistant material. In this case, as illustrated, by temporarily mounting the first electronic component 17a on a substrate component 20 which has higher heat resistance than the printed-circuit board 11a and which withstands heat treatment at some 400 degrees centigrade, and mounting the first electronic component 17a on the printed-circuit board 11a via this substrate component 20, it is possible to mount the first electronic component 17a which requires thermo-compression bonding on the printed-circuit board 11a with low heat resistance.

The substrate component 20 may have a filtering feature in case it is necessary to remove an unwanted signal. The second electronic component 17b may be also coupled to a printed-circuit board via the substrate component 20.

The first electronic component or second electronic component as a high-frequency device includes, but is not limited to, a power amplifier, a mixer, a multiplier, a frequency converter, a high-frequency oscillator, and a low-noise power amplifier.

On one printed-circuit board 11a are formed patch antennas (antennas) 18 comprising a predetermined conductor pattern on the surface opposite that on which the spacer 14 is mounted. The plurality of patch antennas 18 are formed in an array so as to obtain good directivity. The patch antennas 18 includes those transmitting/receiving a radio wave of 25 GHz and connected to the first electronic component 17a via the transmission lines 12, and those transmitting/receiving a radio wave of 5 GHz and connected to the second electronic component 17b via the transmission lines 12.

Instead of supporting multiple frequencies, the patch antennas may be provided to support only one frequency and antennas supporting the other frequency may be provided separately from the electronic component module 10. Instead of an array of antennas, a single multi-band antenna capable of transmitting/receiving radio waves having a plurality of frequencies may be used. An antenna used is not limited to the patch antenna 18 according to this embodiment. Other forms of antennas including a reverse-F antenna and a slot antenna may be used.

On the other printed-circuit board 11b, BGA (Ball Grid Array) terminals 19 each comprising a predetermined conductor pattern 19a and a solder ball 19b formed thereon, that is, a plurality of terminals are formed on the surface opposite that on which the spacer 14 is mounted. The BGA terminals 19 are connected to the first electronic component 17a and the second electronic component 17b via the transmission lines 12. The electronic component module 10 is connected to peripherals via the BGA terminals 19. The terminals need not be BGA terminals 19 but various terminals having other shapes may be used.

As mentioned hereinabove, according to the electronic component module 10 of the embodiment, the first electronic components 17a are installed in the first electromagnetically shielded cavity 16a. The second electronic components 17b whose operating frequency differs from that of the first electronic components 17a are separately installed in the second electromagnetically shielded cavity 16b. The electronic components are thus provided in modules so that the first and second electronic components 17a, 17b are shielded per frequency, thereby improving the isolation characteristic and obtaining a stable performance characteristic.

The electronic component module 10 includes as components the existing printed-circuit boards 11a, 11b and the low-cost spacer 14 extremely easy to work on. Dedicated substrate components including cavities which require a complicated manufacturing process is no longer needed, thus allowing an electronic component module to be manufactured at a low lost.

This allows electronic components operating in frequency bands different from each other to be installed in a single package, thereby providing an electronic component module ready to manufacture at a low cost.

By forming the shape of the cavity 16 so that an unwanted propagation mode or unwanted resonance mode will not take place in the operating frequency band of the electronic component 17 in the cavity 16, it is possible to obtain a good performance characteristic.

The patch antenna 18 is formed on the surface opposite the surface of the printed-circuit board 11a which mounts the spacer 14. This shortens the wiring between the patch antenna 18 and the electronic components 17a, 17b thus reducing the transmission loss.

By mounting the electronic components 17a, 17b on the printed-circuit boards 11a, 11b via the substrate component 20 with higher heat resistance than the printed-circuit boards 11a, 11b, it is possible to mount the electronic components 17a, 17b which require thermo-compression bonding on the printed-circuit boards 11a, 11b with low heat resistance.

As shown in FIG. 3, the first electronic components 17a and the second electronic components 17b may be temporarily mounted on a substrate 21 per cavity 16a, 16b or per operating frequency and then mounted on the printed-circuit boards 11a, 11b via the substrate 21.

As understood from the foregoing description, the invention provides the following advantages.

First electronic components are installed in a first electromagnetically shielded cavity. Second electronic components whose operating frequency differs from that of the first electronic components are separately installed in a second electromagnetically shielded cavity. The electronic components are thus provided in modules so that the first and second electronic components are shielded per frequency, thereby improving the isolation characteristic and obtaining a stable performance characteristic.

The electronic component module according to the invention includes as components existing printed-circuit boards and a low-cost spacer extremely easy to work on. Dedicated substrate components which require a complicated manufacturing process is no longer needed, thus allowing an electronic component module to be manufactured at a low lost.

This allows electronic components operating in frequency bands different from each other to be installed in a single package, thereby providing an electronic component module ready to manufacture at a low cost.

By forming the shape of a cavity so that an unwanted propagation mode or unwanted resonance mode will not take place in the operating frequency band of an electronic component in the cavity, it is possible to obtain a good performance characteristic.

By mounting electronic components on printed-circuit boards via a substrate component with higher heat resistance than the printed-circuit boards, it is possible to mount electronic components which require thermo-compression bonding on the printed-circuit boards with low heat resistance.

What is claimed is:

1. An electronic component module comprising:
   a pair of printed-circuit boards on which a shield layer is formed;
   a spacer positioned between and fixed to said pair of printed-circuit boards, said spacer equipped with a shielding feature which forms as partitions at least a first cavity and a second cavity between said pair of printed-circuit boards;
   at least a first electronic component positioned in said first cavity and mounted on any one of said pair of printed-circuit boards and used in a first frequency band;
   at least a second electronic component positioned in said second cavity and mounted on any one of said pair of printed-circuit boards, said second electronic component used in a second frequency band different from said first frequency band; and
   a plurality of terminals formed on a surface of one of said pair of printed-circuit boards, said surface opposite that on which said spacer is mounted, said terminals connected to said first electronic component and said second electronic component via transmission lines.

2. The electronic component module according to claim 1, comprising at least one of antenna formed on a surface of the other of said pair of printed-circuit boards which does not mount said terminals, said surface opposite that on which said spacer is mounted, wherein said antenna transmits and receives radio waves in at least one of said first frequency band and said second frequency band, said antenna is connected to said corresponding electronic components.

3. The electronic component module according to claim 1, wherein said spacer is made of a metal or a nonmetal on which a metallic shield layer is formed.

4. The electronic component module according to claim 2, wherein said spacer is made of a metal or a nonmetal on which a metallic shield layer is formed.

5. The electronic component module according to claim 1, wherein at least one of said electronic components is mounted on said printed-circuit board via a substrate component with higher heat resistance than said printed-circuit board.

6. The electronic component module according to claim 1, wherein said first electronic component is mounted on one of said pair of printed-circuit boards while said second electronic component is mounted on the other of said pair of printed-circuit boards.

\* \* \* \* \*